(12) United States Patent
Gupta

(10) Patent No.: US 7,019,591 B2
(45) Date of Patent: Mar. 28, 2006

(54) GAIN BOOSTED OPERATIONAL AMPLIFIER HAVING A FIELD EFFECT TRANSISTOR WITH A WELL BIASING SCHEME

(75) Inventor: Sandeep K. Gupta, Alviso, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/123,121

(22) Filed: May 6, 2005

(65) Prior Publication Data

US 2005/0264357 A1    Dec. 1, 2005

Related U.S. Application Data

(63) Continuation of application No. 10/753,194, filed on Jan. 8, 2004, now Pat. No. 6,956,434, which is a continuation of application No. 09/941,694, filed on Aug. 30, 2001, now Pat. No. 6,680,650.

(60) Provisional application No. 60/261,225, filed on Jan. 12, 2001.

(51) Int. Cl.
*H03F 3/45* (2006.01)

(52) U.S. Cl. ........................ 330/253; 330/261

(58) Field of Classification Search ............... 330/263, 330/261, 257, 260, 277, 285, 296; 327/534, 327/535

See application file for complete search history.

(56) References Cited

U.S. PATENT DOCUMENTS

| | | |
|---|---|---|
| 3,609,414 A | 9/1971 | Pleshko et al. |
| 4,550,284 A | 10/1985 | Sooch |
| 4,837,460 A | 6/1989 | Uchida |
| 5,157,279 A | 10/1992 | Lee |
| 5,323,121 A | 6/1994 | Butler |
| 5,689,144 A | 11/1997 | Williams |
| 5,703,522 A | 12/1997 | Arimoto et al. |
| 5,880,620 A | 3/1999 | Gitlin et al. |
| 5,905,402 A | 5/1999 | Kim et al. |
| 5,936,456 A | 8/1999 | Naka |
| 6,023,195 A | 2/2000 | Nakano et al. |
| 6,037,808 A | 3/2000 | Houston et al. |

(Continued)

OTHER PUBLICATIONS

Bernstein, K. et al., "High-Speed Design Styles Leverage IBM Technology Prowess," *MicroNews*, vol. 4, No. 3, 1998. Printed from http://www.chips.ibm.com/micronews/vo14_no3/highspeed.html.

(Continued)

*Primary Examiner*—Henry Choe
(74) *Attorney, Agent, or Firm*—Sterne, Kessler, Goldstein & Fox P.L.L.C.

(57) ABSTRACT

A biasing scheme for a MOSFET that mitigates the MOSFET body effect. The biasing scheme can be realized replicating the voltage at the source terminal of a MOSFET and applying this replicated voltage to the body terminal. In this manner, the effect of the body transconductance, at high frequencies, becomes a function of the ratio of the well-to-substrate capacitance of the MOSFET to the sum of the well-to-substrate capacitance and the source-to-body capacitance of the transistor. At high frequencies, the biasing scheme mitigates the reduction in gain of a source follower caused by the body effect of a driven MOSFET within the source follower, improves the stability of a feedback network established by a gain boosting amplifier and the driven MOSFET by contributing a negative half plane zero to the transfer function of the feedback network, and reduces the power consumed by the gain boosting amplifier.

20 Claims, 9 Drawing Sheets

U.S. PATENT DOCUMENTS

| | | | |
|---|---|---|---|
| 6,064,262 | A | 5/2000 | Wang |
| 6,225,846 | B1 | 5/2001 | Wada et al. |
| 6,229,187 | B1 | 5/2001 | Ju |
| 6,271,713 | B1 | 8/2001 | Krishnamurthy |
| 6,377,120 | B1 * | 4/2002 | Hsieh .................... 330/253 |
| 6,469,568 | B1 | 10/2002 | Toyoyamaet et al. |
| 6,496,066 | B1 * | 12/2002 | Colonna et al. ............ 330/253 |
| 6,724,258 | B1 * | 4/2004 | Fayed .................... 330/260 |

OTHER PUBLICATIONS

Bult, K. and Geelen, G.J.G.M., "A Fast-Settling CMOS Op Amp for SC Circuits with 90-dB DC Gain," *IEEE Journal of Solid-State Circuits*, IEEE, vol. 25, No. 6, Dec. 1990, pp. 1379-1384.

Geerts, Y. et al., "A 3.3-V, 15 bit, Delta Sigma ADC with a Signal Bandwidth of 1.1 MHz for ADSL Applications," *IEEE Journal of Solid-State Circuits*, IEEE, vol. 34, No. 7, Jul. 1999, pp. 927-936.

Marques, A.M. et al., "A 15-b Resolution 2-MHz Nyquist Rate $\Delta\Sigma$ ADC in a 1-µm CMOS Technology," *IEEE Journal of Solid-State Circuits*, IEEE, vol. 33, No. 7, Jul. 1998, pp. 1065-1075.

Gray, P.R. et al., *Analysis and Design of Analog Integrated Circuits: Fourth Edition*, John Wiley & Sons, 2001, pp. ix-xviii, 49-59, 131-145 and 253-336.

Copy of European Search Report for Appln. No. EP 02 25 0156, issued Jun. 4, 2003, 3 pages.

* cited by examiner (CONVENTIONAL GAIN BOOSTED FOLDED CASCODE OPERATIONAL AMPLIFIER)

PRIOR ART
(CONVENTIONAL BIASING NETWORK)

GAIN BOOSTED OPERATIONAL AMPLIFIER HAVING A FIELD EFFECT TRANSISTOR WITH A WELL BIASING SCHEME

CROSS REFERENCE TO RELATED APPLICATIONS

This application is a continuation of U.S. application Ser. No. 10/753,194, filed Jan. 8, 2004, now U.S. Pat. No. 6,956,434 which is incorporated herein in its entirety by reference and which is a continuation of U.S. application Ser. No. 09/941,694, filed Aug. 30, 2001, now U.S. Pat. No. 6,680,650, which claims the benefit of U.S. Provisional Application No. 60/261,225, filed Jan. 12, 2001.

BACKGROUND OF THE INVENTION

1. Field of the Invention

The present invention relates to a biasing scheme that mitigates the MOSFET body effect and reduces the effect of the well-to-substrate capacitance on the MOSFET. More specifically, the present invention, at high frequencies, mitigates the reduction in gain of a source follower caused by the body effect of a driven MOSFET within the source follower, improves the stability of a feedback network established by a gain boosting amplifier and the driven MOSFET, and reduces the power consumed by the gain boosting amplifier.

2. Background Art

Operational amplifiers used in precision switched capacitor circuits are faced with very stringent requirements for their settling behavior and their dc performance. These requirements are particularly important when they are used in high speed, high resolution analog-to-digital converters such as those described in A. M. Marques et al., "A 15b resolution Delta Sigma ADC in a 1um CMOS technology", *IEEE Journal of Solid State Circuits*, pp. 1065–75, July 1998; and Yves Geerts et al., "A 3.3V, 15-bit, Delta-Sigma ADC with a Signal Bandwidth of 1.1 MHz for ADSL applications", *IEEE Journal of Solid State Circuits*, pp. 927–36, July 1999. Often for such applications, the operational amplifiers use a gain boosted folded cascode topology because it can support high gain at wide bandwidths.

FIG. 1 is a schematic diagram of an exemplary conventional gain boosted folded cascode operational amplifier 100. The principles underlying the discussion in relation to FIG. 1 are not intended to be limited to the particular topology of operational amplifier 100.

In FIG. 1, operational amplifier 100 comprises a first active load leg 102 and a second active load leg 104 connected in parallel between a supply voltage "$V_{DD}$" 106 and an analog ground "$V_{AG}$" 108. (The skilled artisan would appreciate that, alternatively, a second supply voltage "$V_{SS}$" could be used in place of $V_{AG}$ 108.) First active load leg 102 comprises a cascoded series of PMOSFETs "M1" 110 and "M3" 112; and a cascoded series of NMOSFETs "M5" 114 and "M7" 116. Second active load leg 104 comprises a cascoded series of PMOSFETs "M2" 118 and "M4" 120; and a cascoded series of NMOSFETs "M6" 122 and "M8" 124.

The gate terminals of M1 110 and M2 118 are together connected to a first bias voltage "$V_{BP}$" 126 to hold the MOSFETs in saturation. The source terminal of M3 112 is connected to the inverting terminal of a gain boosting amplifier "A1" 128, while the output of A1 128 is connected to the gate terminal of M3 112 such that a feedback network "$FN_1$" 130 is established. The source terminal of M4 120 is connected to the inverting terminal of a gain boosting amplifier "A2" 132, while the output of A2 132 is connected to the gate terminal of M4 120 such that a feedback network "$FN_2$" 134 is established. The noninverting terminals of A1 128 and A2 132 are together connected to a second bias voltage "$V_{PREF}$" 136 to hold the corresponding MOSFETs (i.e., M3 112 and M4 120) in saturation.

The source terminal of M5 114 is connected to the inverting terminal of a gain boosting amplifier "A3" 138, while the output of A3 138 is connected to the gate terminal of M5 114 such that a feedback network "$FN_3$" 140 is established. The source terminal of M6 122 is connected to the inverting terminal of a gain boosting amplifier "A4" 142, while the output of A4 142 is connected to the gate terminal of M4 122 such that a feedback network "$FN_4$" 144 is established. The noninverting terminals of A3 138 and A4 142 are together connected to a third bias voltage "$V_{NREF}$" 146 to hold the corresponding MOSFETs (i.e., M5 114 and M6 122) in saturation. The gate terminals of M7 116 and M8 124 are together connected to a fourth bias voltage "$V_{BN}$" 148 to hold the MOSFETs in saturation.

Each feedback network (e.g., $FN_1$ 130, $FN_2$ 134, $FN_3$ 140, or $FN_4$ 144), acts to hold the voltage at the source terminal of its driven MOSFET (e.g., M3 112, M4 120, M5 114, or M6 122) equal to the bias voltage (e.g., $V_{PREF}$ 136 or $V_{NREF}$ 146) applied to the noninverting terminal of the corresponding gain boosting amplifier (e.g., A1 128, A2 132, A3 138, or A4 142). For example, A1 128 detects any difference in voltage between the source terminal of M3 112 and $V_{PREF}$ 136, and drives the voltage at the gate terminal of M3 112 to eliminate the difference.

Operational amplifier 100 further comprises a differential amplifier 150. Differential amplifier 150 comprises a current source "$I_{TAIL}$" 152, a first amplifying PMOSFET "M9" 154, and a second amplifying PMOSFET "M10" 156. The source terminals of M9 154 and M10 156 are connected together in parallel. $I_{TAIL}$ 152 is connected between $V_{DD}$ 106 and the source terminals of M9 154 and M10 156. The drain terminal of M9 154 is connected to the drain terminal of M7 116. The drain terminal of M10 156 is connected to the drain terminal of M8 124. M9 154 and M10 156 comprise a differential pair and act to control the distribution of current flowing from $I_{TAIL}$ 152 between $V_{DD}$ 106 and $V_{AG}$ 108. The sum of the current flowing through both M9 154 and M10 156 equals $I_{TAIL}$ 152.

Operational amplifier 100 receives a differential input signal and produces a differential output signal. The differential input signal comprises a positive input signal "$V_{in}^+$" 158 and a negative input signal "$V_{in}^-$" 160. $V_{in}^+$ 158 is received at the gate terminal of M9 154. $V_{in}^-$ 160 is received at the gate terminal of M10 156. The differential output signal comprises a positive output signal "$V_{out}^+$" 162 and a negative output signal "$V_{out}^-$" 164. $V_{out}^+$ 162 is presented at the drain terminal of M5 114. Vout– 164 is presented at the drain terminal of M6 122.

So, for example, as $V_{in}^+$ 158 rises with respect to $V_{in}^-$ 160, the portion of the total current of $I_{TAIL}$ 152 that flows through M9 154 (i.e., a PMOSFET) and M7 116 becomes smaller, while the portion that flows through M10 156 and M8 124 becomes larger. With the gate-to-source voltages of M7 116 and M8 124 (i.e., NMOSFETs) held equal to $V_{BN}$ 148, the decreased amount of current flowing through M7 116 causes its drain-to-source voltage to decrease, while the increased amount of current flowing through M8 124 causes its drain-to-source voltage to increase. Because the source terminal of M7 116 is connected to $V_{AG}$ 108, the decrease in its drain-to-source voltage is realized as a lower voltage at its drain terminal. Likewise, because the source terminal of M8 124 is connected to $V_{AG}$ 108, the increase in its drain-to-source voltage is realized as a higher voltage at its drain terminal. So, in first active load leg 102, there is a larger drop in voltage potential between $V_{DD}$ 106 and the drain terminal of M7 116, while in second active load leg 104, there is a smaller drop in voltage potential between $V_{DD}$ 106 and the drain terminal of M8 124. Initially, this causes less current to flow through first active load leg 102 and more current to flow through second active load leg 104. However, the MOSFETs in these legs strive to maintain the current flowing through them at a constant level.

As the drain terminal of M7 116 is connected to the source terminal of M5 114, the voltage at the source terminal of M5 114 also falls so that the gate-to-source voltage of M5 114 increases. Because the current flowing through M5 114 strives to remain constant, the increase in the gate-to-source voltage of M5 114 (i.e., a NMOSFET) causes a decrease in its drain-to-source voltage of a larger magnitude than the increase in the gate-to-source voltage. Via $FN_3$ 140, this effect is enhanced by A3 138, which receives the lower voltage at the source terminal of M5 114, inverts it, amplifies it, and applies it to the gate terminal of M5 114 causing the increase in the gate-to-source voltage to be larger than it would be in the absence of A3 138. Consequently, the decrease in the drain-to-source voltage of M5 114 is also larger than it would be in the absence of A3 138. Because $FN_3$ 140 acts to hold the voltage at the source terminal of M5 114 equal to $V_{NREF}$ 146, the decrease in the drain-to-source voltage of M5 114 is realized as a lower voltage at its drain terminal.

With the source-to-gate voltage of M1 110 held equal to the difference between $V_{DD}$ 106 and $V_{BP}$ 126, the initial decrease in the amount of current flowing through M1 110 (i.e., a PMOSFET) causes its source-to-drain voltage to increase. Because the source terminal of M1 110 is connected to $V_{DD}$ 106, the increase in its source-to-drain voltage is realized as a lower voltage at its drain terminal. As the drain terminal of M1 110 is connected to the source terminal of M3 112, the voltage at the source terminal of M3 112 also falls so that the source-to-gate voltage of M3 112 decreases. Because the current flowing through M3 112 strives to remain constant, the decrease in the source-to-gate voltage of M3 112 (i.e., a PMOSFET) causes an increase in its source-to-drain voltage of a larger magnitude than the decrease in the source-to-gate voltage. Via $FN_1$ 130, this effect is enhanced by A1 128, which receives the lower voltage at the source terminal of M3 112, inverts it, amplifies it, and applies it to the gate terminal of M3 112 causing the decrease in the source-to-gate voltage to be larger than it would be in the absence of A1 128. Consequently, the increase in the source-to-drain voltage of M3 112 is also larger than it would be in the absence of A1 128. Because $FN_1$ 130 acts to hold the voltage at the source terminal of M3 112 equal to $V_{PREF}$ 136, the increase in the source-to-drain voltage of M3 112 is realized as a lower voltage at its drain terminal.

Thus, the changes in the drain-to-source voltage of M3 112 and the source-to-drain voltage of M5 114 act to decrease the voltage at $V_{out}^-$ 164. Through a similar but converse process, changes in the drain-to-source voltage of M4 120 and the source-to-drain voltage of M6 122 act to increase the voltage at $V_{out}^+$ 162. In this manner, operational amplifier 100 acts to amplify the rise at $V_{in}^+$ 158 with respect to $V_{in}^-$ 160.

However, the overall settling behavior of operational amplifier 100 can be limited by the parameters of its gain boosting amplifiers (i.e., A1 128, A2 132, A3 138, and A4 142). For example, the gain boosting amplifiers normally require wider bandwidths than does operational amplifier 100 itself. This characteristic is explained in Klaas Bult et al., "A Fast Settling CMOS opamp for SC Circuits with 90-dB DC gain", *IEEE Journal of Solid State Circuits* (December 1990), pp. 1379–1384. Furthermore, the settling performance requirements specifically needed for precision switched capacitor circuits dictate that the gain boosting amplifiers must have fairly high levels of gain and fast settling performances. (For this reason, the gain boosting amplifiers themselves often employ a folded cascode topology.) These requirements essentially necessitate that the MOSFETs within gain boosted operational amplifier 100 be characterized by relatively large capacitive values. Therefore, each gain boosting amplifier (e.g., A1 128, A2 132, A3 138, or A4 142) must drive a relatively large MOSFET (e.g., M3 112, M4 120, M5 114, or M6 122). Unfortunately, physical parameters internal to these MOSFETs can give rise to limitations in the functioning of gain boosted operational amplifier 100.

Under conventional methods for fabricating MOSFETs on integrated circuit chips, both PMOSFETs and NMOSFETs are fabricated on the same chip. Typically, a positively doped semiconductor substrate is used for the chip. Therefore, fabrication of PMOSFETs necessitates the formation of negatively doped semiconductor wells embedded within the positively doped semiconductor substrate. Each negatively doped well comprises a body for a PMOSFET.

FIG. 2A is a cutaway, cross sectional view of a conventionally fabricated PMOSFET 200. The skilled artisan would recognize that PMOSFET 200 comprises a positively doped semiconductor substrate 202. Embedded within substrate 202 is a negatively doped semiconductor well 204. Embedded within well 204 are a first positively doped region 206 and a second positively doped region 208. First and second regions 206, 208 are separated within well 204 by a channel 210. The measure of separation is referred as channel length "L". Additionally, channel 210 has a width "W" (not shown) perpendicular to the plane of FIG. 2A. The ratio W/L is referred to as a "channel constant". A metal oxide layer 212 is deposited onto well 204 and partially covers first and second regions 206, 208. A metal is deposited onto metal oxide layer 212 opposite channel 210 to form a gate terminal 214 for PMOSFET 200. The metal is also deposited opposite region 206 to form a source terminal 216, opposite region 208 to form a drain terminal 218, and opposite well 204 to form a body terminal 220 for PMOSFET 200.

FIG. 2B is a schematic diagram of a small signal model circuit 250 of PMOSFET 200. Circuit 250 comprises five nodes corresponding to gate terminal 214, source terminal 216, drain terminal 218, body terminal 220, and a "substrate" node 252. Typically, substrate 252 is connected to $V_{AG}$ 108. A resistor "$r_0$" 254 is connected between source and drain terminals 216, 218. Resistor $r_0$ 254 models the value of the output resistance of PMOSFET 200. A capacitor "$C_{gs}$" 256 is connected between gate and source terminals 214, 216; a capacitor "$C_{gd}$" 258 is connected between gate and drain terminals 214, 218; a capacitor "$C_{gb}$" 260 is connected between gate and body terminals 214, 220; a capacitor "$C_{sb}$" 262 is connected between source and body terminals 216, 220; a capacitor "$C_{db}$" 264 is connected between drain and body terminals 218, 220; and a capacitor "$C_{well}$" 266 is connected between body terminal 220 and substrate 252. The capacitors model the values of the capacitances between regions within PMOSFET 200.

Two current sources are connected in parallel between source and drain terminals 216, 218: a first current source "$i_g$" 268 and a second current source "$i_b$" 270. $i_g$ 268 models the current producing behavior of PMOSFET 200 due to the small signal voltage potential between gate and source terminals 214, 216. $i_b$ 270 models the current producing behavior of PMOSFET 200 due to the small signal voltage potential between body and source terminals 220, 216.

The value of $i_g$ 268 can be expressed as shown in Eq. (1):

$$i_g = g_m v_{gs}, \qquad \text{Eq. (1)}$$

where "$v_{gs}$" is the small signal voltage potential between gate and source terminals 214, 216, and "$g_m$" is the transconductance due to $v_{gs}$ (i.e., gate transconductance). $g_m$ is defined as shown in Eq. (2):

$$g_m = \Delta I_D / \Delta V_{GS}, \qquad \text{Eq. (2)}$$

where "$\Delta I_D$" is the change in the large signal current passing through drain terminal 218 and "$\Delta V_{GS}$" is the change in the large signal voltage potential between gate and source terminals 214, 216.

The value of $i_b$ 270 can be expressed as shown in Eq. (3):

$$i_b = g_{mb} v_{bs}, \qquad \text{Eq. (3)}$$

where "$v_{bs}$" is the small signal voltage potential between body and source terminals 220, 216, and "$g_{mb}$" is the transconductance due to $v_{bs}$ (i.e., body transconductance). $g_{mb}$ is defined as shown in Eq. (4):

$$g_{mb} = \Delta I_D / \Delta V_{BS}, \qquad \text{Eq. (4)}$$

where "$\Delta V_{BS}$" is the change in the large signal voltage potential between body and source terminals 220, 216.

Often, $C_{gb}$ 260 has a negligible value so that a gate capacitance "$C_g$" (i.e., between gate terminal 214 and the remaining elements of small signal model circuit 250) can be expressed as shown in Eq. (5):

$$C_g = C_{gs} + C_{gd}, \qquad \text{Eq. (5)}$$

As can be observed from FIG. 1, in a conventional gain boosted folded cascode topology, each driven MOSFET (e.g., M3 112, M4 120, M5 114, or M6 122) is usually connected in series with another (non-driven) MOSFET (e.g., M1 110, M2 118, M7 116, or M8 124), such that the source terminal of the driven MOSFET is connected to the drain terminal of the non-driven MOSFET (i.e., the MOSFETs are cascoded). In this configuration, the two MOSFETs form a source follower, with an input signal driving the gate terminal of the driven MOSFET, an output signal produced at the source terminal of the driven MOSFET, and a current source provided by the non-driven MOSFET.

For example, in FIG. 1, A1 128 drives M3 112, which is cascoded with M1 110. In this configuration, M1 110 and M3 112 form a source follower "$SF_1$" 166, with an input signal provided by A1 128 at the gate terminal of M3 112, an output signal (not shown) produced at the source terminal of M3 112, and a current source provided by M1 110. Likewise, M2 118 and M4 120 form a source follower "$SF_2$" 168; M5 114 and M7 116 form a source follower "$SF_3$" 170; and M6 122 and M8 124 form a source follower "$SF_4$" 172.

Thus, each gain boosting amplifier (e.g., A1 128, A2 132, A3 138, or A4 142) drives a capacitive-dominated load "$C_{load}$", which can be expressed as shown in Eq. (6):

$$C_{load} = C_g (1-A), \qquad \text{Eq. (6)}$$

where "A" is the gain of the corresponding source follower. A is defined as shown in Eq. (7):

$$A = v_s / v_g, \qquad \text{Eq. (7)}$$

where "$v_s$" is the small signal voltage at the source terminal of the driven MOSFET (e.g., M3 112, M4 120, M5 114, or M6 122) and "$v_g$" is the small signal voltage at the gate terminal of the driven MOSFET.

When the body terminal of the driven MOSFET is connected to a supply voltage (e.g., $V_{DD}$ 106 for a PMOSFET or $V_{AG}$ 108 for a NMOSFET), the gain A of each source follower can also be derived to be expressed as shown in Eq. (8):

$$A = g_m (g_m + g_{mb}). \qquad \text{Eq. (8)}$$

This is due to the phenomenon of the "MOSFET body effect" in which the body-to-source voltage of a MOSFET acts to change its threshold voltage, and thereby change the drain current for a given gate-to-source voltage. The body effect gives rise to the body transconductance $g_{mb}$, which can be derived to be expressed as shown in Eq. (9):

$$g_{mb} = (\gamma \times g_m)/(V_{SB} + 2|\phi_f|)^{1/2}, \qquad \text{Eq. (9)}$$

where "$\gamma$" is the (process dependent) threshold voltage parameter, "$V_{SB}$" is the large signal voltage potential between the source and body terminals, and "$\phi_f$" is the Fermi potential of the junction. Eq. (8) demonstrates that a large value for body transconductance $g_{mb}$ reduces the value for gain A. This is undesirable. In state of the art CMOS digital processes, $g_{mb}$ for PMOSFETs can have a magnitude equal to 30 to 50 percent of gm. Thus, by application of Eq. (8), A can be as low as 0.65 to 0.75.

As noted above, because of the settling performance requirements of precision switched capacitor circuits, conventional gain boosted folded cascode operational amplifier 200 uses relatively large MOSFETs. Hence, the gate capacitance $C_g$ of each driven MOSFET (e.g., M3 112, M4 120, M5 114, or M6 122) can be fairly substantial. When the gain A of the corresponding source follower (e.g., $SF_1$ 166, $SF_2$ 168, $SF_3$ 170, or $SF_4$ 172) is low, the capacitive-dominated load $C_{load}$ of the corresponding gain boosting amplifier (e.g., A1 128, A2 132, A3 138, or A4 142), by application of Eq. (6), remains significant. In order to carry this significant load, each gain boosting amplifier must consume a relatively large amount of power.

Furthermore, controlling the stability of each feedback network (e.g., $FN_1$ 130, $FN_2$ 134, $FN_3$ 140, or $FN_4$ 144) at high frequencies can be difficult because the capacitance at the source terminal of the driven MOSFET appears as a nondominant pole in the transfer function of the feedback network.

Returning to FIGS. 2A and 2B, conventionally, the MOSFET body effect can be eliminated by connecting body terminal 220 to source terminal 216, rather than to a supply voltage (e.g., $V_{DD}$ 106). However, while this approach removes the effect of the body transconductance $g_{mb}$ on the gain A of the corresponding source follower (and thus, by application of Eq. (6), reduces the capacitive-dominated load $C_{load}$ of the corresponding gain boosting amplifier), it also connects the well-to-substrate capacitance $C_{well}$ 366 to the source terminal 316. This has the effect of moving the nondominant pole in the transfer function to a lower frequency, which reduces the range of stable frequencies over which the feedback network can operate.

What is needed is a mechanism that mitigates the MOSFET body effect and reduces the effect of the well-to-substrate capacitance on the MOSFET.

BRIEF SUMMARY OF THE INVENTION

The present invention relates to a biasing scheme that mitigates the MOSFET body effect and reduces the effect of the well-to-substrate capacitance on the MOSFET. More specifically, the present invention, at high frequencies, mitigates the reduction in gain of a source follower caused by the body effect of a driven MOSFET within the source follower, improves the stability of a feedback network established by a gain boosting amplifier and the driven MOSFET, and reduces the power consumed by the gain boosting amplifier.

The present invention can be realized in any number of embodiments in which a circuit replicates the voltage at the source terminal of a MOSFET and applies this replicated voltage to the body terminal of the MOSFET. In this manner, the circuit mitigates the body effect of the MOSFET. The connection to the body terminal of the MOSFET forms a capacitive divider network at the body terminal that acts to reduce the effect of the body transconductance by a factor of the ratio of the well-to-substrate capacitance of the MOSFET to the sum of the well-to-substrate capacitance and the source-to-body capacitance of the MOSFET. Advantageously, this mitigates the effect of the well-to-substrate capacitance.

In an embodiment, the biasing scheme of the present invention can be realized by another MOSFET. The MOSFET and the other MOSFET are configured so that a voltage at the source terminal of the other MOSFET equals the voltage at the source terminal of the MOSFET. The source terminal of the other MOSFET is connected to the body terminal of the MOSFET.

In another embodiment, the biasing scheme of the present invention can be realized by an operational amplifier. The source terminal of the MOSFET is connected to the noninverting terminal of the operational amplifier and the output of the operational amplifier is connected to the inverting terminal of operational amplifier and to the body terminal of the MOSFET.

In yet another embodiment using an operational amplifier, the biasing scheme of the present invention can be realized by connecting the MOSFET to the operational amplifier to form a feedback network. The inverting terminal of the operational amplifier is connected to the source terminal of the MOSFET and the output of the operational amplifier is connected to the gate terminal of the MOSFET. A bias voltage is connected to the noninverting terminal of the operational amplifier.

In a related embodiment, the bias voltage is connected to the body terminal of the MOSFET. The bias voltage is produced by a biasing network. The biasing network includes a connection to the body terminal of the MOSFET that forms a capacitive divider network at the body terminal.

Alternatively, the bias voltage is replicated by an additional biasing network and the replicated bias voltage is connected to the body terminal of the MOSFET. The additional biasing network has a lower transconductance than the biasing network.

Advantageously, the biasing network or the additional biasing network reduces the capacitive load of the operational amplifier.

Advantageously, the biasing network or the additional biasing network improves the stability of the feedback network by contributing a negative half plane zero to the transfer function of the feedback network.

In an embodiment, the biasing scheme of the present invention can be used for a source follower. Advantageously, the biasing scheme of the present invention mitigates the reduction in gain of the source follower caused by the body effect of the driven MOSFET of the source follower.

In another embodiment, the biasing scheme of the present invention can be used for a gain boosted operational amplifier. In an alternative, the biasing scheme of the present invention is used for the driven PMOSFETs of the gain boosted operational amplifier. In another alternative, the biasing scheme of the present invention is used for the driven NMOSFETs of the gain boosted operational amplifier.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The preferred embodiments of the invention are described with reference to the figures where like reference numbers indicate identical or functionally similar elements. Also in the figures, the left most digit of each reference number identifies the figure in which the reference number is first used.

DETAILED DESCRIPTION OF THE INVENTION

The present invention relates to a biasing scheme that mitigates the MOSFET body effect and reduces the effect of the well-to-substrate capacitance on the MOSFET. More specifically, the present invention, at high frequencies, mitigates the reduction in gain of a source follower caused by the body effect of a driven MOSFET within the source follower, improves the stability of a feedback network established by a gain boosting amplifier and the driven MOSFET, and reduces the power consumed by the gain boosting amplifier.

Figure 3:
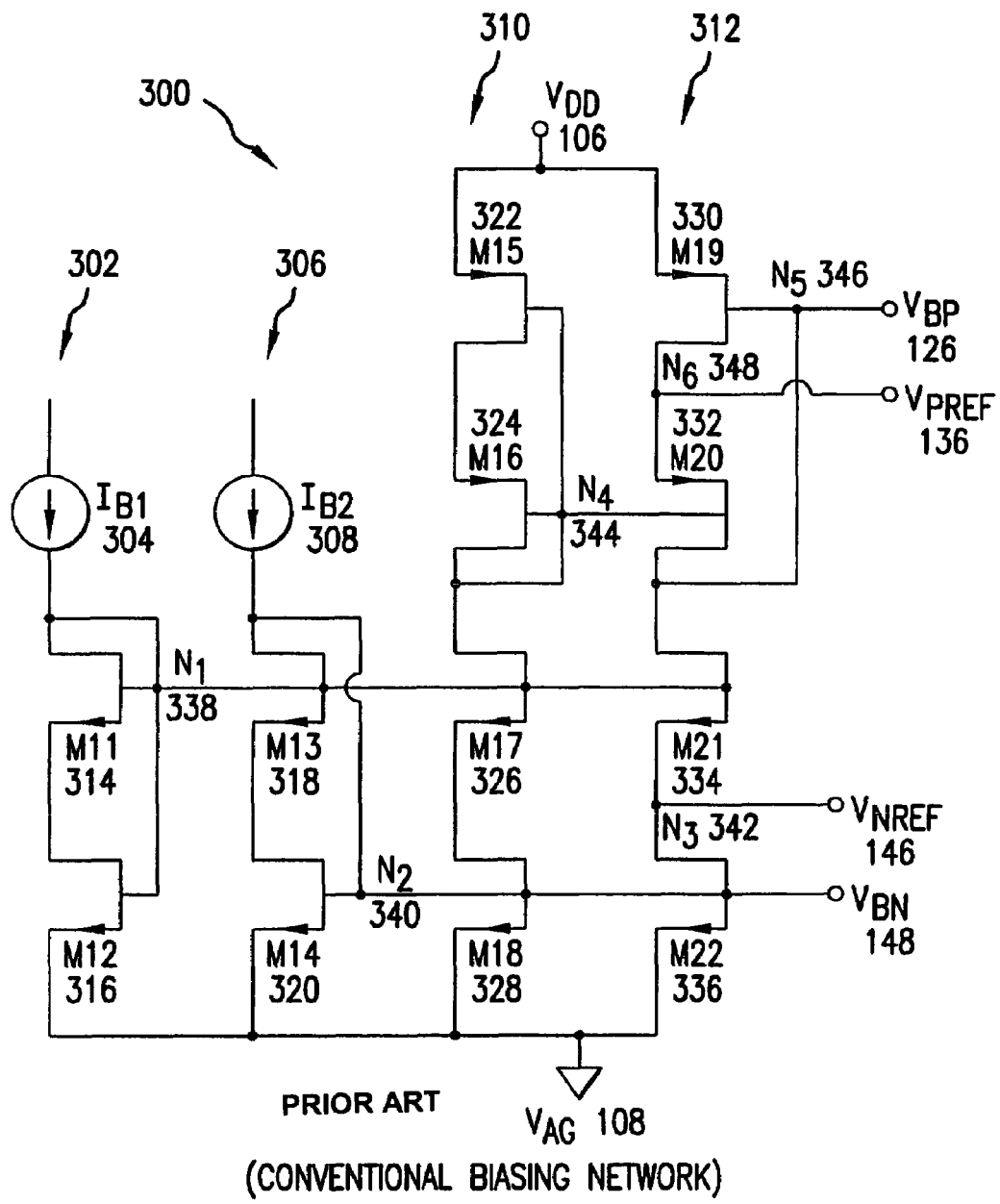
FIG. 3 is a schematic diagram of an exemplary conventional biasing network 300 as would be used to support gain boosted folded cascode operational amplifier 100.

FIG. 3 is a schematic diagram of an exemplary conventional biasing network 300 as would be used to support gain boosted folded cascode operational amplifier 100. The principles underlying the discussion in relation to FIG. 3 are not intended to be limited to the particular topology of biasing network 300.

In FIG. 3, biasing network 300 comprises a first leg 302 connected between a first bias current "$I_{B1}$" 304 and $V_{AG}$ 108, a second leg 306 connected between a second bias current "$I_{B2}$" 308 and $V_{AG}$ 108, a third leg 310 connected between $V_{DD}$ 106 and $V_{AG}$ 108, and a fourth leg 312 connected between $V_{DD}$ 106 and $V_{AG}$ 108. First leg 302 comprises a cascoded series of NMOSFETs "M14" 314 and "M12" 316. Second leg 306 comprises a cascoded series of NMOSFETs "M13" 318 and "M14" 320. Third leg 310 comprises a cascoded series of PMOSFETs "M15" 322 and "M16" 324; and a cascoded series of NMOSFETs "M17" 326 and "M18" 328. Fourth leg 312 comprises a cascoded series of PMOSFETs "M19" 330 and "M20" 332; and a cascoded series of NMOSFETs "M21" 334 and "M22" 336.

The gate terminals of M11 314, M12 316, M13 318, M17 326, and M21 334 are together connected to the drain terminal of M1 1 314 at a node "$N_1$" 338. The gate terminals of M14 320, M18 328, and M22 336 are together connected to the drain terminal of M13 318 in a high swing cascode connection at a node "$N_2$" 340. Equal amounts of current flow from $I_{B1}$ 304 and $I_{B2}$ 308.

With the drain and gate terminals of M11 314 connected together, M11 314 operates in saturation when its gate-to-source voltage exceeds its threshold voltage. Furthermore, the configuration of M11 314 and M12 316 is such that, when M11 314 operates in saturation, M12 316 operates in the triode region because its drain-to-source voltage is always held to be less than its overdrive voltage. In this configuration, M11 314 and M12 316 can be characterized as a single device having an effective channel constant "$(W/L)_{EFF}$" expressed as shown in Eq. (10):

$$(W/L)_{EFF}=[(W/L)_{M11} \times (W/L)_{M12}]/[(W/L)_{M11}+(W/L)_{M12}], \quad \text{Eq. (10)}$$

where "$(W/L)_{M11}$" is the channel constant for M11 314 and "$(W/L)_{M12}$" is the channel constant for M12 316. By knowing the amount of current flowing from $I_{B1}$ 304, $(W/L)_{EFF}$ can be selected as a design parameter to set the voltage at $N_1$ 338 to a desired value.

The voltage at $N_1$ 338 is set to ensure that the gate terminals of M13 318, M17 326, and M21 334 are at a voltage necessary to hold M14 320, M18 328, and M22 336 in saturation. By using the high swing cascode connection at $N_2$ 340 instead of connecting the drain and gate terminals of M14 320 together, the drain-to-source voltage of M14 320 is reduced by the value of its threshold voltage. The channel constants of M14 320, M18 328, and M22 336 are matched and M13 318, M17 326, and M21 334 ensure that the drain-to-source voltages of M14 320, M18 328, and M22 336 are equal. $N_2$ 340 provides bias voltage $V_{BN}$ 148. A node "$N_3$" 342 is located at the source terminal of M21 334 and provides bias voltage $V_{NREF}$ 146.

M13 318, M17 326, and M21 334 are also held in saturation with their channel constants matched. In this manner, the current flowing through M17 326 and M18 328 and the current flowing through M21 334 and M22 336 are made to equal the amount of current flowing from $I_{B1}$ 304 (or $I_{B2}$ 308). Therefore, M17 326 and M18 328 provide a current source for third leg 310, while M21 334 and M22 336 provide a current source for fourth leg 312.

The arrangement of PMOSFETs M15 322, M16 324, M17 326, and M18 332 mirrors the arrangement of, respectively, NMOSFETs M12 316, M11 314, M14 320, and M13 318. Whereas the NMOSFETs are configured with respect to $V_{AG}$ 108, the PMOSFETs are configured with respect to $V_{DD}$ 106.

The gate terminals of M15 322, M16 324, and M20 332 are together connected to the drain terminal of M16 324 at a node "$N_4$" 344. The gate terminal of M19 330 is connected to the drain terminal of M20 332 in a high swing cascode connection at a node "$N_5$" 346. A node "$N_6$" 348 is located at the source terminal of M20 332. Thus, through a process that corresponds to the biasing scheme of the NMOSFETs, $N_5$ 346 provides bias voltage $V_{BP}$ 126, while $N_6$ 348 provides bias voltage $V_{PREF}$ 136.

Figure 4:
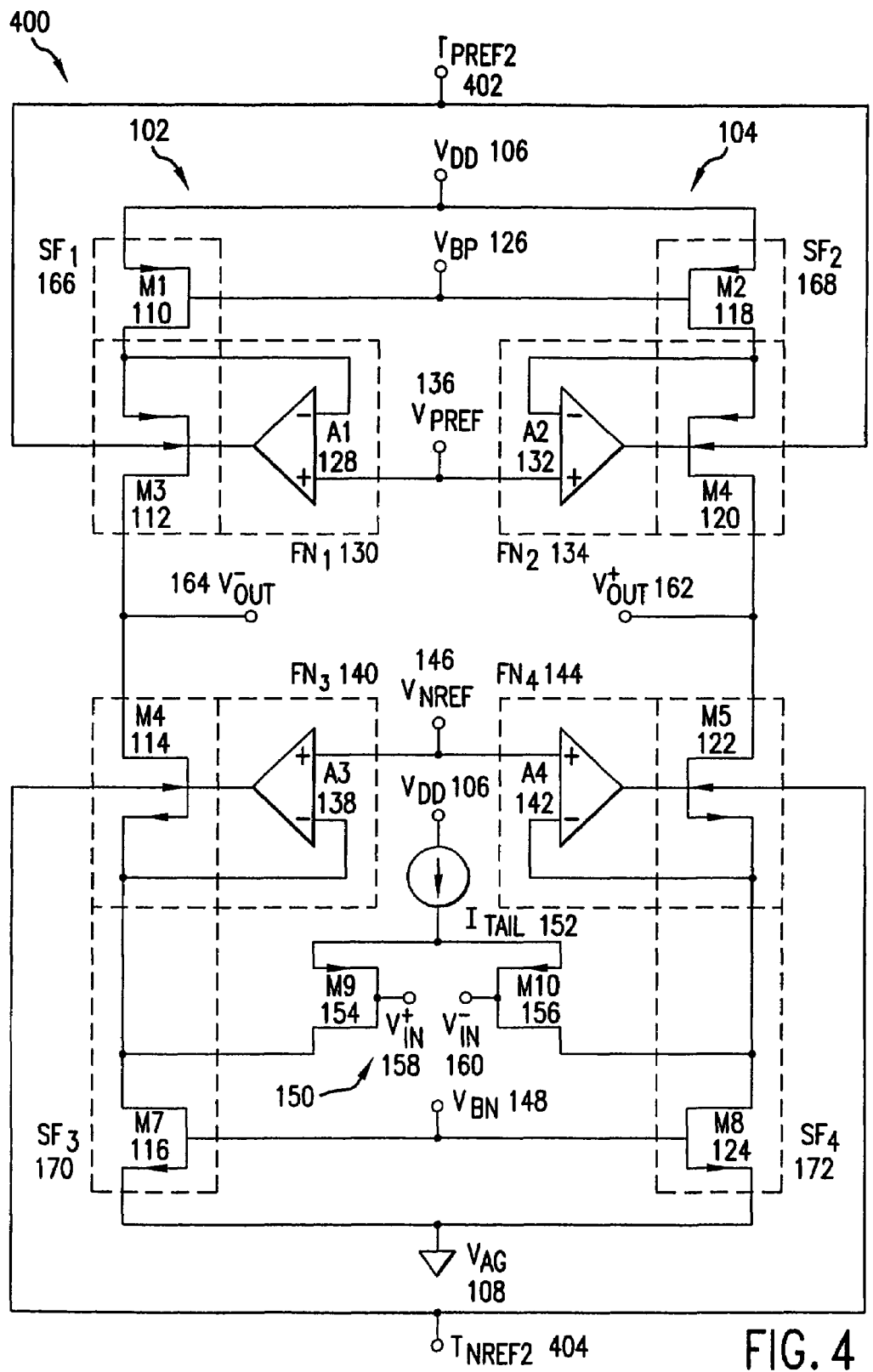
FIG. 4 is a schematic diagram of a representative gain boosted folded cascode operational amplifier 400 with the biasing scheme of the present invention.

FIG. 4 is a schematic diagram of a representative gain boosted folded cascode operational amplifier 400 with the biasing scheme of the present invention. The principles underlying the discussion in relation to FIG. 4 are not intended to be limited to the particular topology of operational amplifier 400.

In FIG. 4, operational amplifier 400 mimics the topology of operational amplifier 100 with some additions. In a first embodiment, the body terminals of M3 112 and M4 120 are joined together by a connection to a bias voltage terminal "$T_{PREF2}$" 402. In a second embodiment, the body terminals of M5 114 and M6 122 are joined together by a connection to a bias voltage terminal "$T_{NREF2}$" 404.

In the first embodiment, a biasing scheme is used to cause the voltage of $T_{PREF2}$ 402 to equal the voltage of $V_{PREF}$ 136. Hence, $T_{PREF2}$ 402 is referred to as a replica bias voltage. Because A1 128 acts to maintain the voltage of the source terminal of M3 112 equal to $V_{PREF}$ 136, the voltages of the source and body terminals of M3 112 are equal. Likewise, because A2 132 acts to maintain the voltage of the source terminal of M4 120 equal to $V_{PREF}$ 136, the voltages of the source and body terminals of M4 120 are equal.

In the second embodiment, a biasing scheme is used to cause the voltage of $T_{NREF2}$ 404 to equal the voltage of $V_{NREF}$ 146. Hence, $T_{NREF2}$ 404 is referred to as a replica bias voltage. Because A3 138 acts to maintain the voltage of the source terminal of M5 114 equal to $V_{NREF}$ 146, the voltages of the source and body terminals of M5 114 are equal. Likewise, because A4 142 acts to maintain the voltage of the source terminal of M6 122 equal to $V_{NREF}$ 146, the voltages of the source and body terminals of M6 122 are equal.

Thus, for each driven MOSFET (e.g., M3 112, M4 120, M5 114, or M6 122), the biasing scheme makes $V_{SB}$ equals zero. On its face, by application of Eq. (9), the effect of having $V_{SB}$ equal to zero appears to increase the value of the body transconductance $g_{mb}$. Hence, by application of Eq. (8), this appears to reduce the gain A of the corresponding source follower (e.g., $SF_1$ 166, $SF_2$ 168, $SF_3$ 170, or $SF_4$ 172), which, by application of Eq. (6), appears to increase the capacitive-dominated load $C_{load}$ of the corresponding gain boosting amplifier (e.g., A1 128, A2 132, A3 138, or A4

142). However, as is demonstrated below, the network that produces the replica bias voltage is configured to mitigate the body effect of the driven MOSFET at high frequencies so to limit the reduction in gain that it causes.

Figure 1:
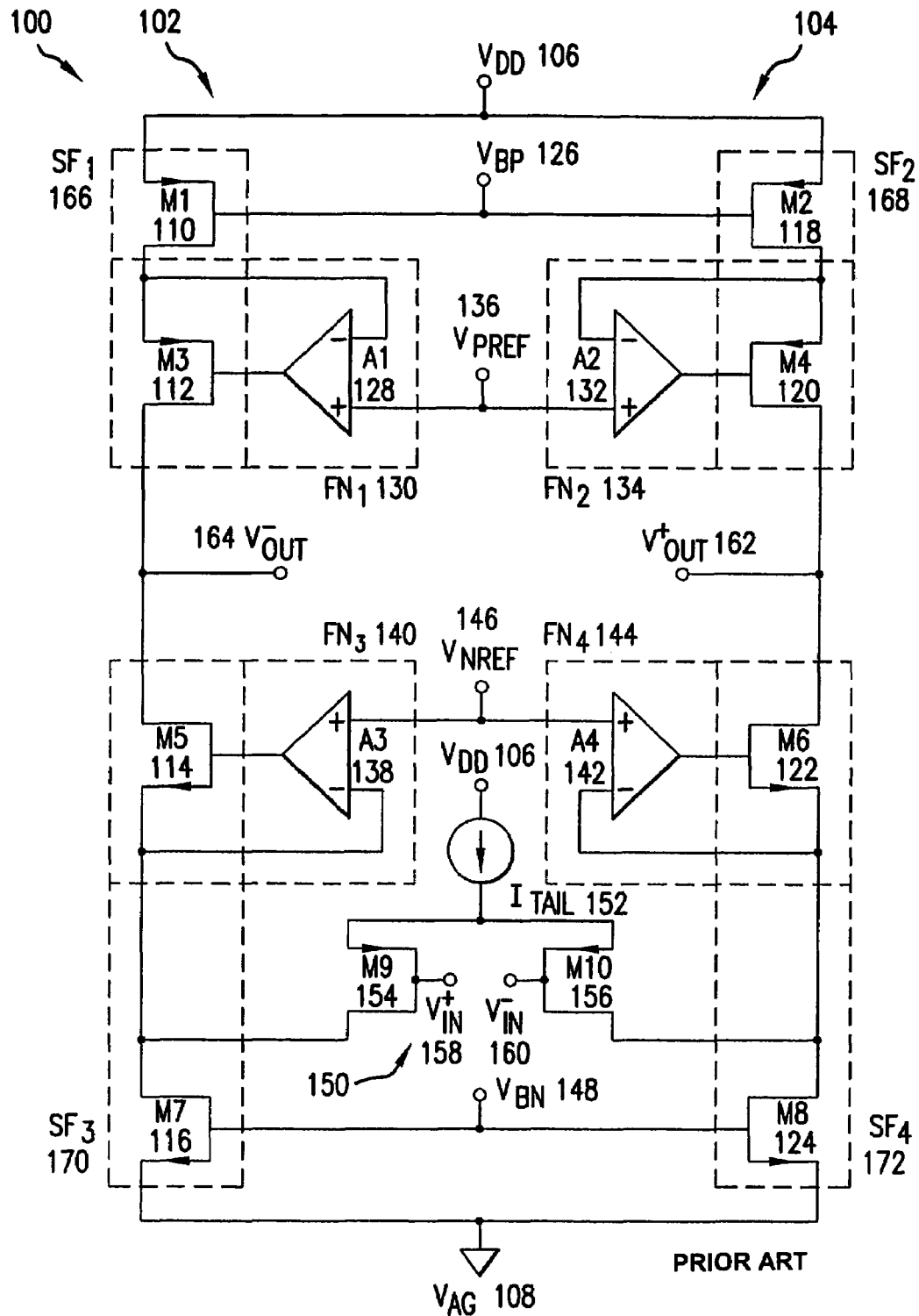
FIG. 1 is a schematic diagram of an exemplary conventional gain boosted folded cascode operational amplifier 100.
Figure 2A:
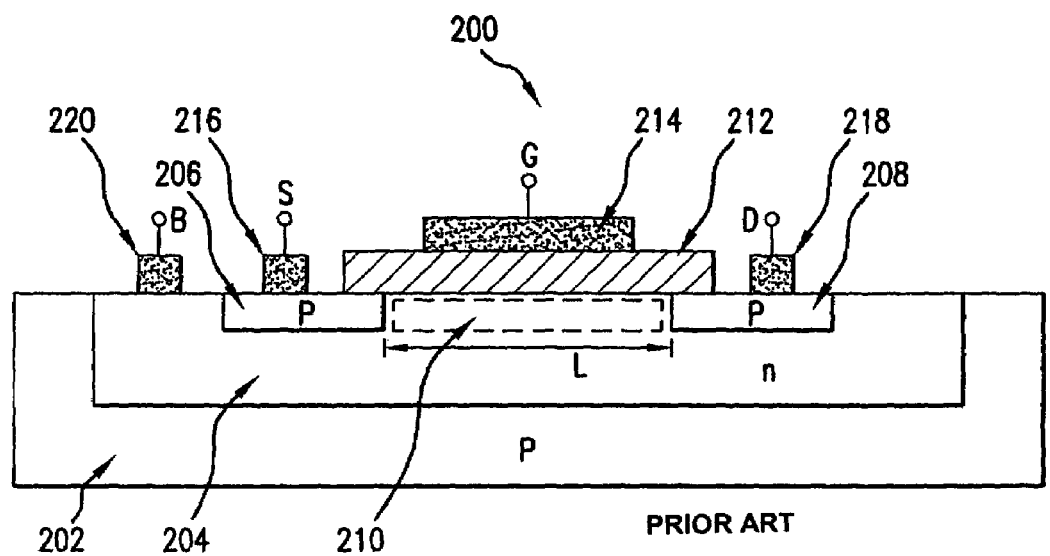
FIG. 2A is a cutaway, cross sectional view of a conventionally fabricated PMOSFET 200.
Figure 2B:
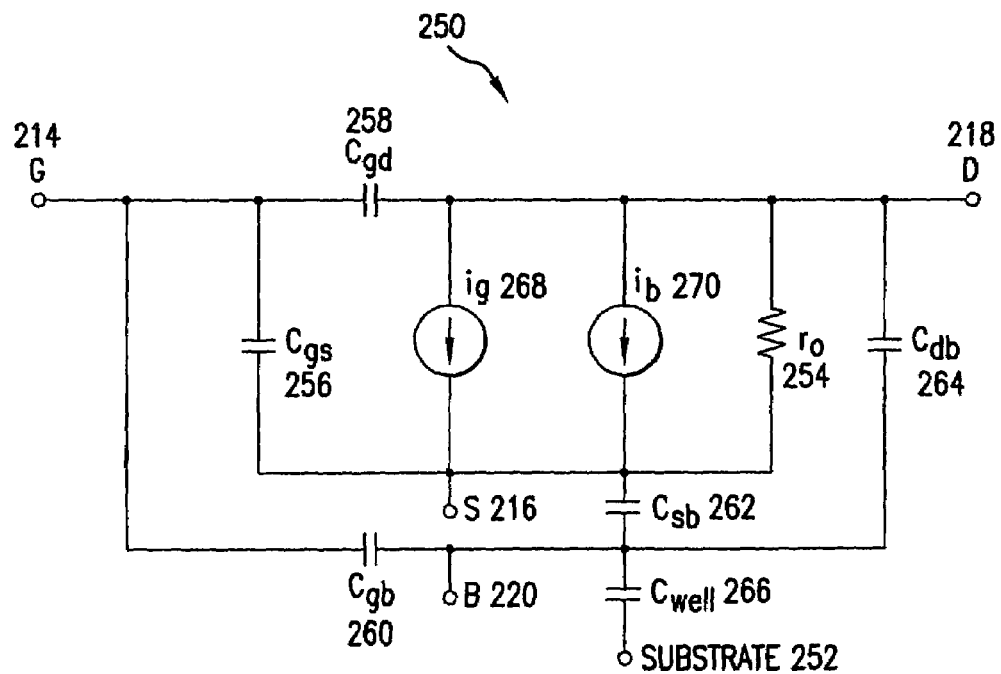
FIG. 2B is a schematic diagram of a small signal model circuit 250 of PMOSFET 200.

As noted above with reference to FIGS. 2A and 2B, conventionally, the MOSFET body effect can be eliminated by connecting body terminal 220 to source terminal 216, rather than to a supply voltage (e.g., $V_{DD}$ 106 or $V_{AG}$ 108). However, while this approach removes the effect of the body transconductance $g_{mb}$ on the gain A of the corresponding source follower (and thus, by application of Eq. (6), reduces the capacitive-dominated load $C_{load}$ of the corresponding gain boosting amplifier), it also connects the well-to-substrate capacitance $C_{well}$ 366 to the source terminal 316. This has the effect of moving the nondominant pole in the transfer function to a lower frequency, which reduces the range of stable frequencies over which the feedback network can operate.

Figure 5:
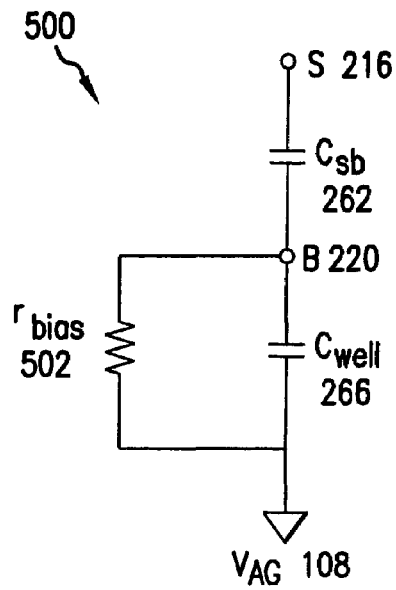
FIG. 5 is a schematic diagram of a capacitive divider model 500 for a MOSFET biased in the manner of the present invention.

FIG. 5 is a schematic diagram of a capacitive divider model 500 for a MOSFET biased in the manner of the present invention. Capacitive divider model 500 schematically represents the physics of a driven MOSFET (e.g., M3 110, M4 120, M5 114, or M6 122) that is biased with the biasing scheme of the present invention. In FIG. 5, $C_{sb}$ 262 is connected between source and body terminals 216, 220. A replica bias voltage network resistor "$r_{bias}$" 502 is connected in parallel with $C_{well}$ 266 between body terminal 220 and $V_{AG}$ 108. $r_{bias}$ 502 represents the resistance realized between body terminal 220 and the replica bias voltage network (described below). One skilled in the art would recognize that $r_{bias}$ 502 can be expressed as shown in Eq. (11):

$$r_{bias} = 1/g_{mbias} \quad \text{Eq. (11)}$$

where "$g_{mbias}$" is the transconductance of a MOSFET that provides the replica bias voltage.

From FIG. 5, the difference between the small signal voltages at source and body terminals 216, 220 can be expressed as shown in Eq. (12):

$$v_s - v_b = v_{sb} = [(sC_{well} + g_{mbias})/(sC_{sb} + sC_{well} + g_{mbias})] \times v_s, \quad \text{Eq. (12)}$$

where "$v_s$" is the small signal voltage at source terminal 216 and "$v_b$" is the small signal voltage at body terminal 220.

Figure 6:
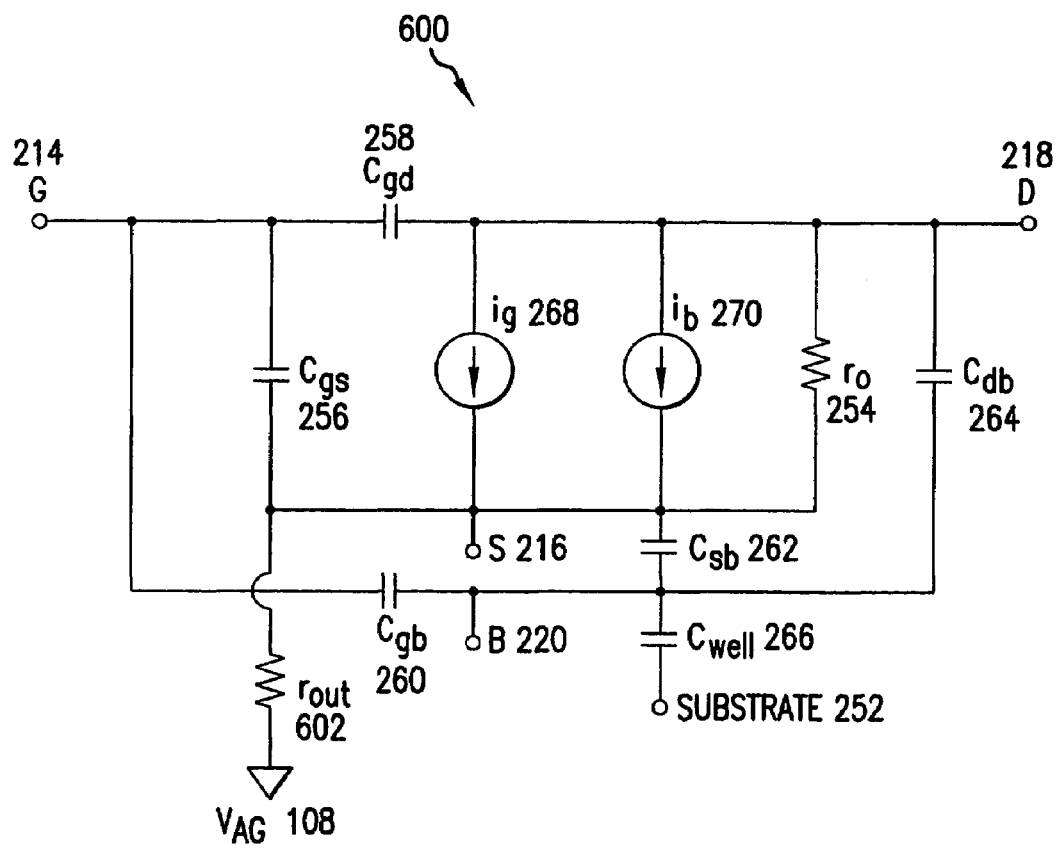
FIG. 6 is a schematic diagram of a small signal model 600 for a source follower.

FIG. 6 is a schematic diagram of a small signal model 600 for a source follower. Small signal model 600 schematically represents the physics of a source follower (e.g., $SF_1$ 166, $SF_2$ 168, $SF_3$ 170, or $SF_4$ 172). In FIG. 6, $i_g$ 268 and $i_b$ 270 are connected in parallel at source terminal 216. A resistor "rout" 602 is connected in series between source terminal 216 and $V_{AG}$ 108. In FIG. 6, $i_g$ 268 models the current producing behavior due to the small signal voltage potential between gate and source terminals 214, 216 for the driven MOSFET (e.g., M3 112, M4 120, M5 114, or M6 124). Likewise, $i_b$ 270 models the current producing behavior due to the small signal voltage potential between body and source terminals 220, 216 for the driven MOSFET. rout 602 represents the output resistance (i.e., $r_o$ 254) provided by the non-driven MOSFET (e.g., M1 110, M2 118, M7 116, or M8 124).

From FIG. 6, $v_s$ can be expressed as shown in Eq. (13):

$$v_s = (g_m v_{gs} + g_{mb} v_{bs}) \times r_{out}. \quad \text{Eq. (13)}$$

Because $v_{SB}$ of Eq. (13) equals $-v_{SB}$ of Eq. (12), Eq. (13) can be recast as Eq. (14):

$$v_s = [(g_m v_{gs}) - \{g_{mb} \times [(sC_{well} + g_{mbias})/(sC_{sb} + sC_{well} + g_{mbias})] \times v_s\}] \times r_{out}. \quad \text{Eq. (14)}$$

Also, $v_{gs}$ can be defined as shown in Eq. (15):

$$v_{gs} = v_g - v_s, \quad \text{Eq. (15)}$$

where "$v_g$" is the voltage of gate terminal 214 (not shown) of the driven MOSFET. Hence, Eq. (14) can again be recast as shown in Eq. (16):

$$v_s = (g_m v_g - g_m v_s - \{g_{mb} v_s \times [(sC_{well} + g_{mbias})/(sC_{sb} + sC_{well} + g_{mbias})]\}) \times r_{out}. \quad \text{Eq. (16)}$$

Recalling Eq. (7), Eq. (16) can be rearranged as shown in Eq. (17) as an expression for the gain A of the source follower:

$$A = g_m r_{out}/(1 + g_m r_{out} + \{(g_{mb} r_{out} \times [(sC_{well} + g_{mbias})/(sC_{sb} + sC_{well} + g_{mbias})]\}). \quad \text{Eq. (17)}$$

When $g_m r_{out} \gg 1$, Eq. (17) can be simplified as shown in Eq. (18):

$$A = g_m/(g_m + \{g_{mb} \times [sC_{well} + g_{mbias})/(sC_{sb} + sC_{well} + g_{mbias})]\}). \quad \text{Eq. (18)}$$

Observing Eq. (18), the skilled artisan would note that for high frequencies, $sC_{well} \gg g_{mbias}$. Therefore, for high frequencies, Eq. (18) can be further simplified as shown in Eq. (19):

$$A = g_m/g_m + \{g_{mb} \times [C_{well}/(C_{sb} + C_{well})]\}). \quad \text{Eq. (19)}$$

Thus, for high frequencies, the effect of the body transconductance $g_{mb}$ on the gain A of the corresponding source follower (and hence the capacitive-dominated load $C_{load}$ of the corresponding gain boosting amplifier) is reduced by the factor of $C_{well}/(C_{sb} + C_{well})$.

Because VSB equals zero, the source-to-body junction of the driven MOSFET has no reverse bias across it. Therefore, $C_{sb}$ can be comparable (or greater) in value than $C_{well}$, which has a large reverse bias across it caused by the replica bias voltage. So, typical values for $C_{well}/(C_{sb} + C_{well})$ can be about 0.5 (or less). Recalling Eq. (6), increasing the gain A of the corresponding source follower advantageously reduces the capacitive-dominated load $C_{load}$ of the corresponding gain boosting amplifier (e.g., A1 128, A2 132, A3 138, or A4 142). By reducing this load, each gain boosting amplifier can consume less power.

Because the effect of the body transconductance $g_{mb}$ is reduced at high frequencies, higher gains can be supported over a wider bandwidth, as shown in Eq. (8).

The biasing scheme of the present invention contributes a negative half plane zero to the transfer function of the feedback network (e.g., $FN_1$ 130, $FN_2$ 134, $FN_3$ 140, or FN 144). The negative half plane zero is located approximately at $g_{mbias}/(C_{sb} + C_{well})$. This improves the stability of the feedback network. Additionally, the biasing scheme of the present invention further improves the stability of the feedback network by precluding a move of a nondominant pole in the transfer function to a lower frequency, as would occur if body and source terminals 220, 216 were directly connected together.

To implement the biasing scheme of the present invention, the replica bias voltage can be produced by biasing network 300. In an embodiment, the voltage at $N_6$ 348, which provides $V_{PREF}$ 136, can also be applied to $T_{PREF2}$ 402. In this embodiment, $g_{mbias}$ would approximately equal the transconductance of M20 332 (see Eq. (10)). One skilled in the art would recognize that, depending upon the application, only the driven PMOSFETs (e.g., M3 112 and M4 120) would require a replica bias voltage. For example, in one fabrication process, $g_{mb}$ of the NMOSFETs is substantially smaller than $g_{mb}$ of the PMOSFETs so that only the driven PMOSFETs would require a replica bias voltage. However, in another embodiment, the voltage at N3 342, which provides $V_{NREF}$ 146, can also be applied to $T_{NREF2}$ 404. In this embodiment, $g_{mbias}$ would approximately equal the transconductance of M21 334. In yet another embodiment, appropriate replica bias voltages are applied to both the driven PMOSFETs and the driven NMOSFETs (e.g., M5 114 and M6 122).

Advantageously for each of the above embodiments, when the objective of the biasing scheme is to ensure that the voltage of $T_{PREF2}$ 402 equals $V_{PREF}$ 136 (or that the voltage of $T_{NREF2}$ 404 equals $V_{NREF}$ 146), tying both terminals to the same node substantially ensures that this objective will be realized. Furthermore, by using biasing network 300 to produce the replica bias voltage, no additional biasing circuitry is needed.

However, as noted above, because of the settling performance requirements of precision switched capacitor circuits, gain boosted operational amplifier 400 uses relatively large MOSFETs. Because of this, the gain boosting amplifiers (i.e., A1 128, A2 132, A3 138, and A4 142) can consume relatively large amounts of power. Under these conditions, it can be necessary that the MOSFETs of biasing network 300 themselves be relatively large. When this is the case, $g_{mbias}$, realized as the transconductance of M20 332 or M21 334, can have a value that is large enough to diminish the advantages of the biasing scheme as explained above in reference to Eqs. (18) and (19).

Furthermore, because $V_{PREF}$ 136 is input to gain boosting amplifiers A1 128 and A2 132, it couples, via the differential pairs within A1 128 and A2 132, to the source terminals of MOSFETs M3 112 and M4 120. Such couplings contribute several pole-zero doublets to the transfer functions of feedback networks $FN_1$ 130 and $FN_2$ 134. Likewise, because $V_{NREF}$ 166 is input to gain boosting amplifiers A3 138 and A4 142, it couples, via the differential pairs within A3 138 and A4 142, to the source terminals of MOSFETs M5 114 and M6 122. Such couplings contribute several pole-zero doublets to the transfer functions of feedback networks $FN_3$ 140 and $FN_4$ 144. While the effect of these couplings is canceled when operational amplifier 400 functions in its differential mode, they do adversely impact its common mode stability.

Figure 7:
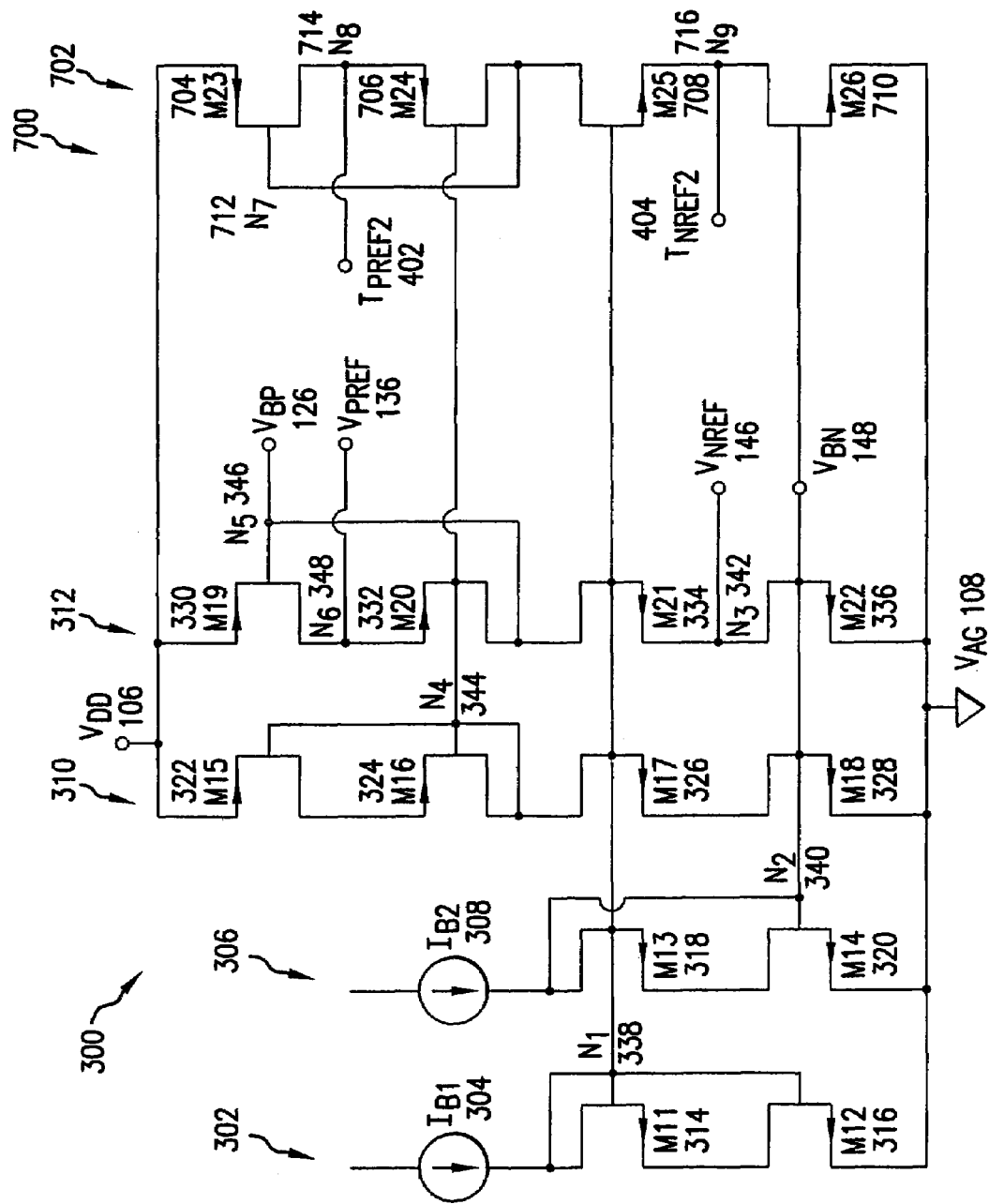
FIG. 7 is a schematic diagram of conventional biasing network 300 with additional biasing network 700 of the present invention.

Alternatively, an additional biasing network 700 can produce the replica bias voltage to implement the biasing scheme of the present invention. FIG. 7 is a schematic diagram of conventional biasing network 300 with additional biasing network 700 of the present invention. The principles underlying the discussion in relation to FIG. 7 are not intended to be limited to the particular topology of additional biasing network 700.

In FIG. 7, additional biasing network 700 comprises a fifth leg 702 connected between $V_{DD}$ 106 and $V_{AG}$ 108. Fifth leg 702 comprises a cascoded series of PMOSFETs "M23" 704 and "M24" 706; and a cascoded series of NMOSFETs "M25" 708 and "M26" 710.

The configuration of fifth leg 702 mimics the configuration of fourth leg 412. The gate terminals of M11 314, M12 316, M13 318, M17 326, M21 334, and M25 708 are together connected to the drain terminal of M11 314 at $N_1$ 338. The gate terminals of M14 320, M18 328, M22 336, and M26 710 are together connected to the drain terminal of M13 318 in a high swing cascode connection at $N_2$ 340. The gate terminals of M15 322, M16 324, M20 332, and M24 706 are together connected to the drain terminal of M16 324 at $N_4$ 344. The gate terminal of M23 704 is connected to the drain terminal of M24 706 in a high swing cascode connection at a node "$N_7$" 712. Each of the MOSFETs in fifth leg 702 is held in saturation.

The channel constants of M14 320, M18 328, M22 336, and M26 710 are matched and M13 318, M17 326, M21 334, and M25 708 ensure that the drain-to-source voltages of M14 320, M18 328, M22 336, and M26 710 are equal. Similarly, the channel constants of M20 332 and M24 706 are matched so that the source-to-drain voltages of M19 330 and M23 704 are equal. Also, the source-to-drain voltages of M20 332 and M24 706 are equal due to identical currents flowing through fourth leg 312 and fifth leg 702.

In an embodiment, a node "$N_8$" 714 is located at the source terminal of M24 706 and provides a bias voltage equal to $V_{PREF}$ 136 that can be applied to $T_{PREF2}$ 402. In this embodiment, $g_{mbias}$ would equal the transconductance of M24 706.

In another embodiment, a node "$N_9$" 716 is located at the source terminal of M25 708 and provides a bias voltage equal to $V_{NREF}$ 146 that can be applied to $T_{NREF2}$ 404. In this embodiment, $g_{mbias}$ would equal the transconductance of M25 708.

In yet another embodiment, appropriate replica bias voltages are applied to both the driven PMOSFETs (e.g., M3 112 and M4 118) and the driven NMOSFETs (e.g., M5 114 and M6 122).

Advantageously for each of the above embodiments, the MOSFETs used in additional biasing network 700 do not need to need to provide any additional biasing voltages and therefore enjoy a greater degree of design freedom in their sizing. Therefore, the MOSFETs used in additional biasing network 700 can be appropriately sized so that $g_{mbias}$, realized as the transconductance of M24 706 or M25 708, can have a value that can exploit the advantages of the biasing scheme as explained above in reference to Eqs. (18) and (19).

Furthermore, using additional biasing network 700 to produce the replica bias voltage isolates $T_{PREF2}$ 402 and $T_{NREF2}$ 404 from other bias voltages so that the devices that provide these other bias voltages are not coupled to the body terminals of the driven MOSFETs (e.g., M3 112, M4 120, M5 114, and M6 122). This also avoids the coupling through the differential pairs within the gain boosting amplifiers (e.g., A1 128, A2 132, A3 138, and A4 142) which would otherwise have resulted if $V_{PREF}$ 136 and $V_{NREF}$ 146 had been used to supply the body terminals. Thus, it avoids the adverse impact on the common mode stability of operational amplifier 400.

In a practical embodiment of gain boosted folded cascode operational amplifier 400 functioning with biasing network 300 including additional biasing network 700, the phase margin of the feedback network can, for a given bandwidth, be improved by 10 to 15 degrees. This allows operational amplifier 400 to operate with stability at bandwidths of up to 700 to 800 MHz.

One skilled in the art would recognize that the present invention offers a design tradeoff between reducing the power consumed by a gain boosting amplifier and improving the phase margin of a feedback network, such that both parameters are a function of the value of $g_{mbias}$.

Figure 8:
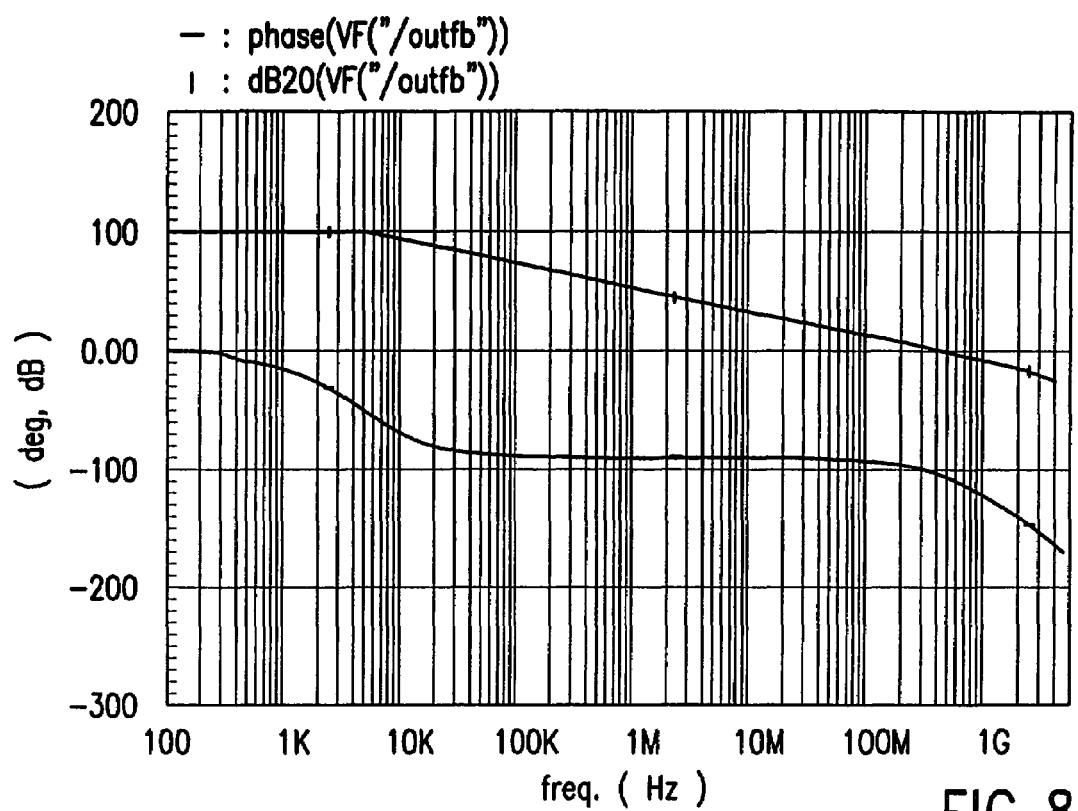
FIG. 8 is a Bode plot of a simulated response of gain boosted folded cascode operational amplifier 400 biased in the manner of the present invention.

FIG. 8 is a Bode plot of a simulated response of gain boosted folded cascode operational amplifier 400 biased in the manner of the present invention. Simulated operational amplifier 400 is used as a component of a simulated switched capacitor circuit with a feedback factor of approximately 0.5 and an equivalent load capacitance of about 6 pF.

The feedback network has a bandwidth of 530 MHz, a phase margin of 74 degrees, and a dc loop gain of 102 dB.

Figure 9:
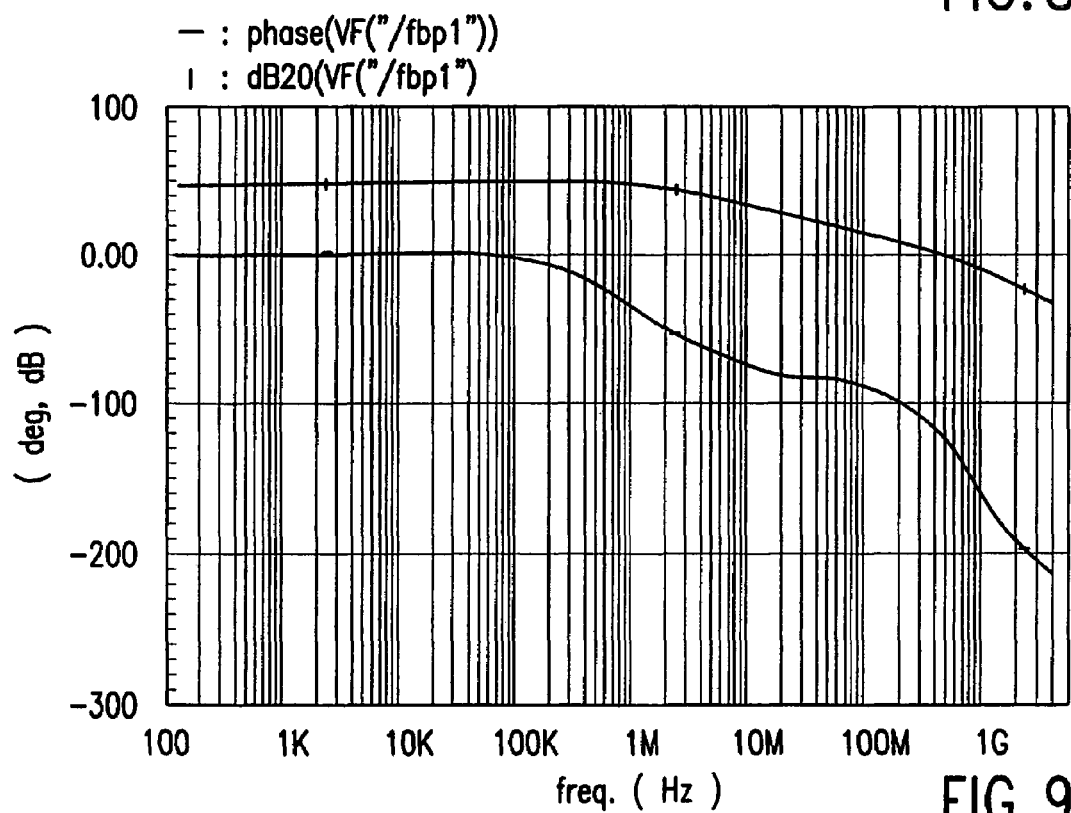
FIG. 9 is a Bode plot of a simulated response of a gain boosting amplifier (e.g., A1 128, A2 132, A3 138, or A4 142) driving a MOSFET (e.g., M3 112, M4 120, M5 114, or M6 122) biased in the manner of the present invention.

FIG. 9 is a Bode plot of a simulated response of a gain boosting amplifier (e.g., A1 128, A2 132, A3 138, or A4 142) driving a MOSFET (e.g., M3 112, M4 120, M5 114, or M6 122) biased in the manner of the present invention. The feedback network of the simulated gain boosting amplifier has a bandwidth of 630 MHz, a phase margin of 59 degrees, and a dc loop gain of 47.5 dB.

Gain boosted folded cascode operational amplifier 400 employing the biasing scheme of the present invention enjoys an improved phase margin of about 10 degrees. The capacitive loads of the gain boosting amplifiers (e.g., A1 128, A2 132, A3 138, or A4 142) with feedback networks biased in the manner of the present invention is about 15 percent of the total gate capacitance of the driven MOSFETs. Thus, each gain boosting amplifier drives a capacitive load of about 300 fF, as opposed to as much as 800 fF in the absence of the biasing scheme of the present invention. The lower capacitive loads also reduce the power consumed by the gain boosting amplifiers by about 50 percent. Without the biasing scheme of the present invention, a pair of gain boosting amplifiers driving PMOSFETs could consume 11.5 mW, while providing an effective bandwidth of 630 MHz. In this configuration, the total power consumed by operational amplifier 400 would be about 59 mW.

An embodiment of gain boosted folded cascode operational amplifier 400 biased in the manner of the present invention has been realized in 0.35 μm/3.3v devices fabricated by a standard CMOS digital process.

The above explanation of the present invention has been in the context of employing it in a gain boosted folded cascode operational amplifier. However, in a more general sense, the present invention relates to biasing scheme that mitigates the MOSFET body effect and reduces the effect of the well-to-substrate capacitance on the MOSFET. The skilled artisan would appreciate that, in the general sense of biasing a MOSFET, the present invention can be realized in any number of embodiments in which a circuit replicates the voltage at the source terminal of a MOSFET and applies this replicated voltage to the body terminal.

Figure 10A:
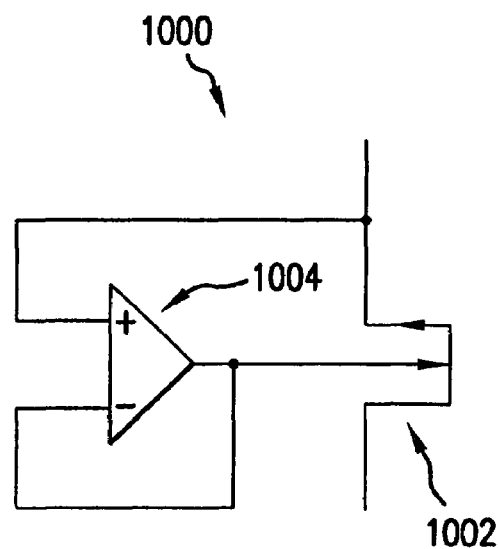
FIG. 10A is a schematic diagram of an embodiment 1000 of the present invention to bias a MOSFET 1002.

FIG. 10A is a schematic diagram of an embodiment 1000 of the present invention to bias a MOSFET 1002. In FIG. 10A, the source terminal of MOSFET 1002 is connected to the noninverting terminal of an operational amplifier 1004. The output of operational amplifier 1004 is applied both to its inverting terminal and to the body terminal of MOSFET 1002. Because operational amplifier 1004 acts to make the voltages at it inverting and noninverting terminals equal, and because the voltage at the inverting terminal is equal to the voltage at the output, operational amplifier 1004 comprises a circuit that replicates the voltage at the source terminal of MOSFET 1002 and applies this replicated voltage to the body terminal of MOSFET 1002.

Figure 10B:
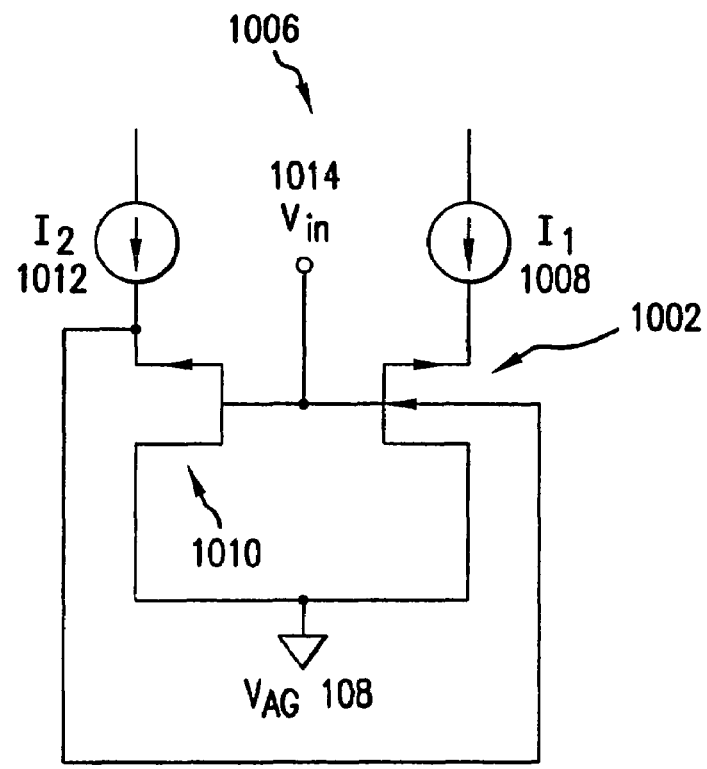
FIG. 10B is a schematic diagram of an alternative embodiment 1006 of the present invention to bias MOSFET 1002.

FIG. 10B is a schematic diagram of an alternative embodiment 1006 of the present invention to bias MOSFET 1002. In FIG. 10B, MOSFET 1002 is connected between a first current source "I$_1$" 1008 and V$_{AG}$ 108. A second MOSFET 1010 is connected between a second current source "I$_2$" 1012 and V$_{AG}$ 108. Equal amounts of current flow from I$_1$ 1008 and I$_2$ 1012. The gate terminals of MOSFETs 1002 and 1010 are together connected to an input signal voltage "v$_{in}$" 1014. The channel constants of MOSFETs 1002 and 1010 are matched. Because currents I$_1$ 1008 and I$_2$ 1012 are equal, the channel constants of MOSFETs 1002 and 1010 are matched, the drain terminals of MOSFETs 1002 and 1010 are connected to V$_{AG}$ 108, and v$_{in}$ 1014 is applied to the gate terminals of both MOSFETs 1002 and 1010, the voltage at the source terminal of MOSFET 1010 equals the voltage at the source terminal of MOSFET 1002. A connection from the source terminal of MOSFET 1010 applies the voltage at this terminal to the body terminal of MOSFET 1002. In this configuration, MOSFET 1010 comprises a circuit that replicates the voltage at the source terminal of MOSFET 1002 and applies this replicated voltage to the body terminal.

As FIGS. 10A and 10B demonstrate, the skilled artisan could conceive of any number of circuits that could bias MOSFET 1002 in the manner of the present invention.

Figure 11:
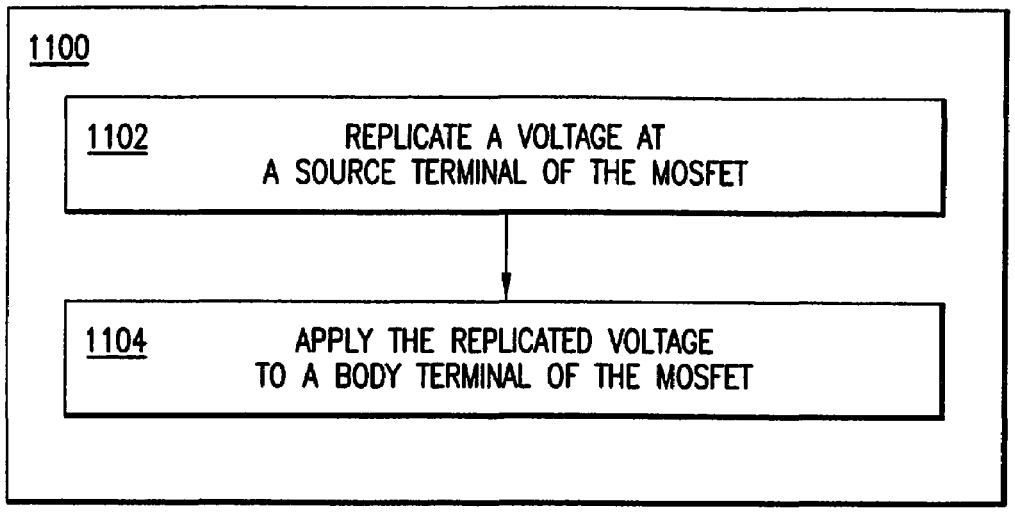
FIG. 11 shows a flow chart of a method 1100 for biasing a MOSFET.

FIG. 11 shows a flow chart of a method 1100 for biasing a MOSFET. In FIG. 11, at a step 1102, a voltage at a source terminal of the MOSFET is replicated. At a step 1104, the replicated voltage is applied to a body terminal of the MOSFET.

In an embodiment, the voltage at the source terminal of the MOSFET is controlled. Further to explain controlling the voltage of the source terminal, FIG. 12 shows a flow chart of a method 1200 for controlling the voltage of the source terminal of the MOSFET.

Figure 12:
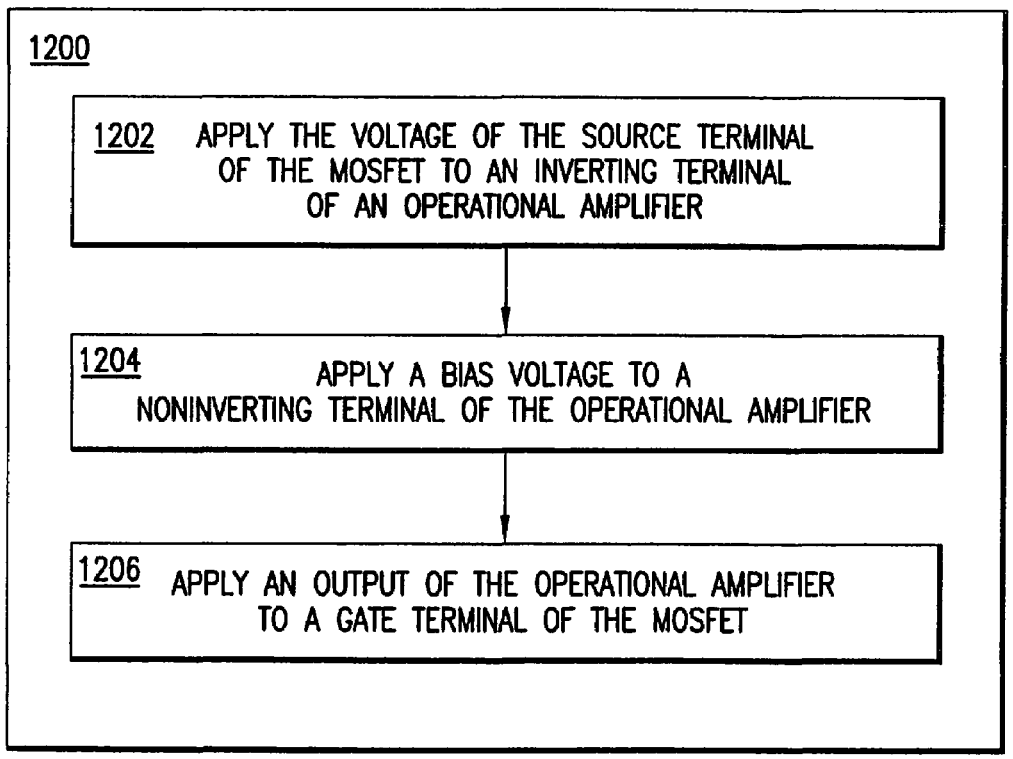
FIG. 12 shows a flow chart of a method 1200 for controlling the voltage of the source terminal of the MOSFET.

In FIG. 12, at a step 1202, the voltage of the source terminal of the MOSFET is applied to an inverting terminal of an operational amplifier. At a step 1204, a bias voltage is applied to a noninverting terminal of the operational amplifier. At a step 1206, an output of the operational amplifier is applied to a gate terminal of the MOSFET, thereby controlling the voltage of the source terminal of the MOSFET.

In an embodiment, the bias voltage applied to the noninverting terminal of the operational amplifier can be used as the replicated voltage in step 1104. In another embodiment, the bias voltage applied to the noninverting terminal of the operational amplifier can be replicated at step 1104.

In various alternative embodiments, method 1100 can be used to mitigate the reduction in gain of a source follower that is caused by the body effect of a driven MOSFET of the source follower, to improve the stability of a feedback network established by an operational amplifier that drives a MOSFET, or to reduce the power consumed by an operational amplifier that drives a MOSFET.

CONCLUSION

While various embodiments of the present invention have been described above, it should be understood that they have been presented by way of example, and not limitation. It would be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A gain boosted operational amplifier, comprising:
    a field effect transistor coupled to a current source and to an input of the gain boosted operational amplifier;
    a first source follower coupled to said field effect transistor and to an output of the gain boosted operational amplifier;
    a first bias network coupled to a body terminal of a field effect transistor of said first source follower and configured to produce a first reference voltage;
    a first operational amplifier coupled to a source terminal of said field effect transistor of said first source follower;

a second bias network coupled to said first operational amplifier and configured to produce a second reference voltage, said second reference voltage substantially equal to said first reference voltage;

a second source follower coupled to said output;

a second operational amplifier coupled to a source terminal of a field effect transistor of said second source follower; and a third bias network coupled to said second operational amplifier and configured to produce a third reference voltage.

2. The gain boosted operational amplifier of claim 1, wherein said first bias network is said second bias network.

3. The gain boosted operational amplifier of claim 1, wherein a transconductance of said first bias network is less than a transconductance of said second bias network.

4. The gain boosted operational amplifier of claim 1, further comprising a fourth bias network coupled to a body terminal of said field effect transistor of said second source follower and configured to produce a fourth reference voltage, said fourth reference voltage substantially equal to said third reference voltage.

5. The gain boosted operational amplifier of claim 4, wherein said third bias network is said fourth bias network.

6. A gain boosted operational amplifier, comprising:

a field effect transistor coupled to a current source and to an input of the gain boosted operational amplifier;

a first source follower coupled to said field effect transistor and to an output of the gain boosted operational amplifier;

a first operational amplifier coupled to a source terminal of a field effect transistor of said first source follower;

a first bias network coupled to said first operational amplifier and configured to produce a first reference voltage;

a second source follower coupled to said output;

a second bias network coupled to a body terminal of a field effect transistor of said second source follower and configured to produce a second reference voltage;

a second operational amplifier coupled to a source terminal of said field effect transistor of said second source follower; and a third bias network coupled to said second operational amplifier and configured to produce a third reference voltage, said third reference voltage substantially equal to said second reference voltage.

7. The gain boosted operational amplifier of claim 6, wherein said second bias network is said third bias network.

8. The gain boosted operational amplifier of claim 6, wherein a transconductance of said second bias network is less than a transconductance of said third bias network.

9. The gain boosted operational amplifier of claim 6, further comprising a fourth bias network coupled to a body terminal of said field effect transistor of said first source follower and configured to produce a fourth reference voltage, said fourth reference voltage substantially equal to said first reference voltage.

10. The gain boosted operational amplifier of claim 9, wherein said first bias network is said fourth bias network.

11. A method for increasing a gain of a source follower, comprising the steps of:

(1) providing, from at least one device, a bias voltage substantially equal to a voltage at a source terminal of a field effect transistor of the source follower; and (2) applying the bias voltage directly from the at least one device to a body terminal of the field effect transistor.

12. The method of claim 11, wherein an impedance of the at least one device is negligible in comparison with an impedance between the body terminal and a substrate on which the field effect transistor is formed.

13. The method of claim 12, wherein the impedance between the body terminal and the substrate is a function of a frequency of a voltage signal received at a gate terminal of the field effect transistor and a capacitance between the body terminal and the substrate.

14. The method of claim 11, wherein a capacitive divider network is formed where the at least one device is connected to the body terminal.

15. The method of claim 11, wherein the at least one device is a biasing network.

16. A method for improving a stability of a feedback network established between an operational amplifier and a field effect transistor, comprising the steps of:

(1) providing, from at least one device, a bias voltage substantially equal to a voltage at a source terminal of the field effect transistor; and (2) applying the bias voltage directly from the at least one device to a body terminal of the field effect transistor;

wherein the source terminal of the field effect transistor is connected to an inverting terminal of the operational amplifier and an output terminal of the operational amplifier is connected to a gate terminal of the field effect transistor.

17. The method of claim 16, wherein an impedance of the at least one device is negligible in comparison with an impedance between the body terminal and a substrate on which the field effect transistor is formed.

18. The method of claim 17, wherein the impedance between the body terminal and the substrate is a function of a frequency of a voltage signal received at the gate terminal and a capacitance between the body terminal and the substrate.

19. The method of claim 16, wherein a capacitive divider network is formed where the at least one device is connected to the body terminal.

20. The method of claim 16, wherein the at least one device is a biasing network.

* * * * *